United States Patent
Lagahe Blanchard et al.

(10) Patent No.: US 8,927,320 B2
(45) Date of Patent: Jan. 6, 2015

(54) METHOD OF BONDING BY MOLECULAR BONDING

(75) Inventors: Chrystelle Lagahe Blanchard, Crolles (FR); Marcel Broekaart, Theys (FR); Arnaud Castex, Grenoble (FR)

(73) Assignee: Soitec, Bernin (FR)

( * ) Notice: Subject to any disclaimer, the term of this patent is extended or adjusted under 35 U.S.C. 154(b) by 282 days.

(21) Appl. No.: 13/380,731

(22) PCT Filed: Jun. 11, 2010

(86) PCT No.: PCT/EP2010/058244
§ 371 (c)(1),
(2), (4) Date: Mar. 19, 2012

(87) PCT Pub. No.: WO2010/149512
PCT Pub. Date: Dec. 29, 2010

(65) Prior Publication Data
US 2012/0164778 A1    Jun. 28, 2012

(30) Foreign Application Priority Data
Jun. 26, 2009    (FR) ...................................... 09 54382

(51) Int. Cl.
| | | |
|---|---|---|
| *H01L 21/762* | (2006.01) | |
| *H01L 31/02* | (2006.01) | |
| *B32B 37/10* | (2006.01) | |
| *H01L 21/20* | (2006.01) | |

(52) U.S. Cl.
CPC ...... *H01L 21/2007* (2013.01); *H01L 21/76254* (2013.01); *H01L 21/76251* (2013.01)
USPC ................ 438/66; 257/E31.11; 257/E21.567; 438/459; 156/538

(58) Field of Classification Search
CPC ............... H01L 21/76251; H01L 2224/81894; H01L 21/762
See application file for complete search history.

(56) References Cited

U.S. PATENT DOCUMENTS

| | | | |
|---|---|---|---|
| 3,728,694 A | 4/1973 | Rohrer | |
| 5,131,968 A | 7/1992 | Wells | |
| 5,478,782 A * | 12/1995 | Satoh et al. | ................... 438/455 |
| 5,769,991 A | 6/1998 | Miyazawa et al. | |
| 5,843,832 A | 12/1998 | Farmer et al. | |

(Continued)

FOREIGN PATENT DOCUMENTS

| | | |
|---|---|---|
| EP | 0410679 A | 1/1991 |
| EP | 1698460 A1 | 9/2006 |

(Continued)

OTHER PUBLICATIONS

Japanese Office Action for Japanese Patent Application No. P2012-515447 dated Aug. 13, 2013, 4 pages.

(Continued)

*Primary Examiner* — Charles Garber
*Assistant Examiner* — Alia Sabur
(74) *Attorney, Agent, or Firm* — TraskBritt

(57) ABSTRACT

A method of bonding by molecular bonding between at least one lower wafer and an upper wafer comprises positioning the upper wafer on the lower wafer. In accordance with the invention, a contact force is applied to a peripheral side of at least one of the two wafers in order to initiate a bonding wave between the two wafers.

20 Claims, 5 Drawing Sheets

(56) References Cited

U.S. PATENT DOCUMENTS

| | | | |
|---|---|---|---|
| 5,959,957 A | 9/1999 | Ikeda et al. | |
| 5,962,792 A | 10/1999 | Kimerer | |
| 6,335,263 B1 | 1/2002 | Cheung et al. | |
| 6,620,285 B2 | 9/2003 | Tomita et al. | |
| 6,969,667 B2 | 11/2005 | Liebeskind et al. | |
| 7,084,045 B2 | 8/2006 | Takayama et al. | |
| 7,601,271 B2 | 10/2009 | Kerdiles et al. | |
| 8,163,570 B2 | 4/2012 | Castex et al. | |
| 2002/0069964 A1 | 6/2002 | Noda et al. | |
| 2002/0127821 A1 | 9/2002 | Ohya et al. | |
| 2003/0183307 A1 | 10/2003 | Liebeskind et al. | |
| 2004/0110320 A1 | 6/2004 | Aspar et al. | |
| 2004/0246795 A1* | 12/2004 | Tomita | 365/200 |
| 2004/0262772 A1 | 12/2004 | Ramanathan et al. | |
| 2005/0178495 A1 | 8/2005 | Aspar et al. | |
| 2005/0260828 A1 | 11/2005 | Yuasa | |
| 2006/0030074 A1 | 2/2006 | Mund | |
| 2006/0043512 A1 | 3/2006 | Oliver et al. | |
| 2006/0044450 A1 | 3/2006 | Wolterink et al. | |
| 2006/0060074 A1 | 3/2006 | Ham | |
| 2006/0180860 A1 | 8/2006 | Pan et al. | |
| 2006/0192230 A1 | 8/2006 | Wood et al. | |
| 2006/0210234 A1* | 9/2006 | Shiv et al. | 385/147 |
| 2007/0004172 A1 | 1/2007 | Yang | |
| 2007/0087531 A1* | 4/2007 | Kirk et al. | 438/458 |
| 2007/0090299 A1 | 4/2007 | Kozakai et al. | |
| 2007/0119812 A1* | 5/2007 | Kerdiles et al. | 216/34 |
| 2007/0148480 A1 | 6/2007 | Ishiwata et al. | |
| 2007/0181246 A1 | 8/2007 | Yamashita et al. | |
| 2007/0207566 A1 | 9/2007 | Fu et al. | |
| 2008/0132032 A1 | 6/2008 | Tomita et al. | |
| 2008/0245472 A1 | 10/2008 | Hirata et al. | |
| 2008/0296584 A1 | 12/2008 | Hachigo | |
| 2009/0081432 A1 | 3/2009 | Gomi | |
| 2009/0275165 A1* | 11/2009 | Pourquier | 438/63 |
| 2009/0280595 A1 | 11/2009 | Broekaart et al. | |
| 2011/0278691 A1 | 11/2011 | Castex et al. | |
| 2011/0287604 A1 | 11/2011 | Castex et al. | |
| 2012/0028440 A1 | 2/2012 | Castex et al. | |

FOREIGN PATENT DOCUMENTS

| | | | |
|---|---|---|---|
| EP | 1777278 A1 | | 4/2007 |
| FR | 2866982 A | | 9/2005 |
| FR | 2931014 A | | 11/2009 |
| JP | 05152181 A | | 6/1993 |
| JP | 09148207 A | | 6/1997 |
| JP | 10256107 A | | 9/1998 |
| JP | 11026733 A | | 1/1999 |
| JP | 2002190435 A | | 7/2002 |
| JP | 2006303087 A | * | 11/2006 |
| KR | 1020080063857 A | | 7/2008 |
| WO | 02071475 A1 | | 9/2002 |
| WO | 03081664 A2 | | 10/2003 |
| WO | 2006078631 A2 | | 7/2006 |
| WO | 2010023082 | | 3/2010 |
| WO | 2010102943 A1 | | 9/2010 |

OTHER PUBLICATIONS

Burns et al., "A Wafer Scale 3 D Circuit Integration Technology", IEEE Transactions on Electron Devices, vol. 53, No. 10, Oct. 2006, pp. 2507-2516.

Haisma et al, "Silicon Wafer Fabrication and (Potential) Applications of Direct Bonded Silicon", Philips Journal of Research, vol. 49, No. 1/2, 1995, pp. 65-89.

Horie et al: "Advanced Soi Devices Using CMP and Wafer Bonding": Extended Abstracts of the Intn. Conf. on Solid State Devices and Materials; Japan Society of Applied Physics; Tokyo JP vol. Con. 1996; pp. 473-475.

International Search Report for International Application No. PCT/EP2010/058244 dated Aug. 13, 2010, 4 pages.

Kim-Lee et al., "Capillary assisted alignment for high density wafer-level integration," in Proceedings of Conference on Wafer Bonding for MEMS Technologies and Wafer-Level Integration, 25-6 (2007).

Steen et al, Overlay as the Key to Drive Wafer Scale 3D Integration, Microelectronic Engineering, vol. 84 (2007) pp. 1412-1415.

Turner et al., "Mechanics of wafer bonding: Effect of clamping," Journal of Applied Physics, vol. 95, 349-55 (2004).

Turner et al., "Modeling of direct wafer bonding: Effect of wafer bow and etch patterns," Journal of Applied Physics, 92, 7658-66 (2002).

Turner et al., "Predicting distortions and overlay errors due to wafer deformation during chucking on lithography scanners," Journal of Micro/Nanolithography, MEMS, and MOEMS, 8, 043015 (2009).

International Preliminary Report on Patentability for International Application No. PCT/EP2010/058244 dated Jan. 4, 2012, 7 pages.

International Written Opinion for International Application No. PCT/EP2010/058244 dated Aug. 13, 2010, 4 pages.

* cited by examiner

METHOD OF BONDING BY MOLECULAR BONDING

CROSS-REFERENCE TO RELATED APPLICATION

This is a national phase entry under 35 U.S.C. §371 of International Patent Application PCT/EP2010/058244, filed Jun. 11, 2010, published in English as International Patent Publication WO 2010/149512 A1 on Dec. 29, 2010, which claims the benefit under Article 8 of the Patent Cooperation Treaty to French Patent Application Serial No. 0954382, filed Jun. 26, 2009, the entire disclosure of each of which is hereby incorporated herein by this reference.

TECHNICAL FIELD

The present invention relates to the field of producing multilayer semiconductor wafers or substrates produced by transfer of at least one layer formed by an initial substrate onto a final substrate, the transferred layer corresponding to a portion of the initial substrate. The transferred layer may further comprise all or part of a component or of a plurality of microcomponents.

BACKGROUND

More precisely, the present invention relates to the problem of heterogeneous deformations that appear during transfer of a layer from a substrate termed the "donor substrate" onto a final substrate termed the "receiving substrate." Such deformations have in particular been observed in the context of three-dimensional component integration technology (3D integration), which requires the transfer of one or more layers of microcomponents onto a final support substrate, and also in the context of circuit transfer or in the production of back-lit imaging devices. The transferred layer or layers include the microcomponents (electronic, optoelectronic, etc.) produced at least in part on an initial substrate, the layers then being stacked onto a final substrate that may possibly itself include components. Particularly because of the very reduced size and large number of the microcomponents present on the same layer, each transferred layer must be positioned on the final substrate with great accuracy in order to be in very strict alignment with the subjacent layer. Furthermore, it may be necessary to carry out treatments on the layer after transfer thereof, for example, in order to form other microcomponents, to uncover the microcomponents on the surface, to produce interconnections, etc.

However, the Applicant has observed that, after transfer, there are situations in which it is very difficult or even impossible to form additional microcomponents in alignment with the microcomponents formed before the transfer.

This phenomenon of misalignment is described with reference to FIGS. 1A to 1E that illustrate an example of producing a three-dimensional structure comprising transfer, onto a final substrate, of a layer of microcomponents formed on an initial substrate, and the formation of an additional layer of microcomponents on the exposed face of the initial substrate after bonding. FIGS. 1A and 1B illustrate an initial substrate 10 with a first series of microcomponents 11 formed thereon. The microcomponents 11 are formed by photolithography using a mask in order to define zones for the formation of patterns corresponding to the microcomponents 11 to be produced.

As can be seen in FIG. 1C, the face of the initial substrate 10 comprising the microcomponents 11 is then brought into intimate contact with one face of a final substrate 20. Bonding between the initial substrate 10 and the final substrate 20 is generally carried out by molecular bonding. Thus, a buried layer of microcomponents 11 is obtained at the bonding interface between the substrates 10 and 20. After bonding and as can be seen in FIG. 1D, the initial substrate 10 is thinned in order to withdraw a portion of the material present above the layer of microcomponents 11. Thus, a composite structure 30 is obtained, formed by the final substrate 20 and a layer 10a corresponding to the remaining portion of the initial substrate 10.

As can be seen in FIG. 1E, the next step in producing the three-dimensional structure consists in forming a second layer of microcomponents 12 at the exposed surface of the thinned initial substrate 10, or of carrying out additional technical steps on that exposed surface in alignment with the components included in the layer 10a (contact points, interconnections, etc.). For the purposes of simplification, in the remainder of the text, the term "microcomponents" is applied to devices or any other patterns resulting from the process steps carried out on or that are in layers where the positioning must be accurately controlled. They may thus be active or passive components, with a single contact point or with interconnections.

Thus, in order to form the microcomponents 12 in alignment with the buried microcomponents 11, a photolithography mask is used that is similar to that used to form the microcomponents 11. The transferred layers, like the layer 10a, typically include marks, both at the level of the microcomponents and at the level of the wafer forming the layer, that are used by the positioning and alignment tools during the processing steps such as those carried out during photolithography.

However, even when positioning tools are employed, offsets are produced between certain of the microcomponents 11 and 12, such as the offsets $\Delta_{11}, \Delta_{22}, \Delta_{33}, \Delta_{44}$, indicated in FIG. 1E (respectively corresponding to the offsets observed between the pairs of microcomponents $11_1/12_1, 11_2/12_2, 11_3/12_3, 11_4/12_4$, etc.).

Such offsets do not result from elementary transformations (translation, rotation or combinations thereof) that could originate from an inaccurate assembly of the substrates. These offsets result in non-homogeneous deformations that appear in the layer originating from the initial substrate during its assembly with the final substrate. In fact, such deformations cause local, non-uniform movements at certain microcomponents 11. In addition, certain of the microcomponents 12 formed on the exposed surface of the substrate after transfer have positional variations with the microcomponents 11 that may be of the order of a few hundred nanometers or even a micrometer.

The phenomenon of misalignment (also termed "overlay") between the two layers of microcomponents 11 and 12 may be a source of short-circuits, distortions in the stack or connection defects between the microcomponents of the two layers. Thus, when the transferred microcomponents are imaging devices formed by pixels and the post-transfer treatment steps are intended to form color filters on each of these pixels, a loss of the colorization function has been observed for some of the pixels.

The phenomenon of misalignment thus results in a reduction in the quality and value of the multilayer semiconductor wafers produced. The impact of that phenomenon is becoming much greater due to the constant demand for miniaturization of microcomponents and their integration density per layer.

Alignment problems during the manufacture of three-dimensional structures are well known. The document by Burns et al., "A Wafer-Scale 3-D Circuit Integration Technology," IEEE Transactions on Electron Devices, vol. 53, No. 10, October 2006, describes a method of detecting alignment variations between bonded substrates. The document by Haisma et al., "Silicon-Wafer Fabrication and (Potential) Applications of Direct-Bonded Silicon," Philips Journal of Research, Vol. 49, No. 1/2, 1995, emphasizes the importance of wafer flatness, in particular during the polishing steps, in order to obtain good quality final wafers, i.e., with the smallest possible number of offsets between the microcomponents. However, those documents deal only with the problem of positioning the wafers during assembly thereof. As explained above, the Applicant has observed that even when the alignment between two wafers is perfect while they are being brought into contact (using marks provided for that purpose), non-homogeneous movements of certain microcomponents occur following initiation of the bonding wave.

BRIEF SUMMARY

The aim of the invention is to provide a solution that can limit non-homogeneous deformations that appear in a substrate during transfer thereof onto another substrate.

To this end, the present invention proposes a method of bonding by molecular bonding between at least a lower wafer and an upper wafer, comprising positioning the upper wafer over the lower wafer, in which method, in accordance with the invention, a contact force is applied to the peripheral side of at least one of the two wafers in order to initiate a bonding wave between the two wafers.

By means of the method of the invention, mechanical contact between the tool for initiating application of the contact force and the face of a wafer is avoided. Thus, non-homogeneous deformations caused in the wafer are reduced while carrying out bonding by molecular bonding over the entirety of the surfaces of the two wafers in contact, the vertical component and/or the vibrations resulting from application of the contact force allowing initiation of a bonding wave.

Furthermore, by applying a contact force to the peripheral side of one of the two wafers, even if deformations are induced, these are localized to the edge of the wafers, i.e., outside the useful zones of the wafer.

By thereby minimizing and isolating the deformations usually caused by applying a contact point to one of the surfaces of the wafers in order to produce bonding by molecular bonding, the risks of misalignment or distortion (overlay) during the subsequent formation of additional layers of microcomponents are avoided.

In accordance with one particular characteristic of the invention, at least one chock is used to maintain the two wafers in position during application of the contact force. When each wafer comprises an alignment key such as a notch or a flat, a chock is preferably placed at the alignment keys in order to maintain the micrometric alignment of the two wafers produced when positioning them before bonding by molecular bonding.

The chock is preferably disposed in a position diametrically opposite to the region for application of the contact force.

The contact force may be applied to the peripheral side of a single wafer or both wafers at the same time depending on the size and shape of the tool used.

The contact force may be directed in a direction substantially parallel to the plane of the wafers or may form an angle therewith.

The contact force may be applied to the side of one or both wafers in a direction forming an angle with the plane of the wafers in the range −90° to +90°.

By controlling the angle with which the contact force is applied to one or both wafers, it is possible to adjust the vertical component of the contact force to a certain extent. In fact, the larger the angle between the direction of application of the contact force and the plane of the wafers, the greater will be the vertical component, and vice versa.

In accordance with one aspect of the invention, the contact force is applied to the peripheral side of the upper wafer, the force being directed in a direction forming an angle with the plane of the upper wafer that is more than 0° and less than +45°.

In accordance with a further aspect of the invention, the contact force is applied to the peripheral side of the lower wafer, the force being directed in a direction forming an angle with the plane of the lower wafer that is more than −45° and less than 0°.

By limiting the angle formed between the direction of application of the contact force and the plane of the wafers, a vertical component of the contact force is created that means that a bonding wave with a magnitude that is smaller than that of the contact force can be created, meaning that deformations and stresses on the face of the wafer can be minimized.

In accordance with another aspect of the invention, the intensity of the applied contact force corresponds to a mechanical pressure of less than 2 MPa [megapascal].

The contact force is preferably applied to the peripheral side of at least one of the two wafers by at least one impulse. The impulse may be repeated one or more times until a bonding wave is initiated.

The contact force may be applied by pressing on a tool on the peripheral side of one or both wafers.

The end of the tool intended to press on the side of one or both wafers preferably comprises on its surface a material selected from at least TEFLON®, silicone, and a polymer.

The present invention also provides a method of producing a composite three-dimensional structure, comprising a step of producing a first layer of microcomponents on one face of first wafer or substrate and a step of bonding the face of the first wafer comprising the layer of microcomponents onto a second wafer or substrate, the method being characterized in that the bonding step is carried out in accordance with the bonding by molecular bonding method of the invention.

Employing the bonding by molecular bonding method of the present invention means that, during transfer of a layer of microcomponents, the phenomenon of overlay can be eliminated or limited and that very high quality multilayer semiconductor wafers can be produced. The layer of microcomponents may in particular include image sensors.

The present invention also provides a device for bonding by molecular bonding between at least one lower wafer and an upper wafer, comprising a substrate carrier device and a tool for applying a contact force, in which device the application tool is arranged to apply a contact force to the peripheral side of at least one of the two wafers in order to initiate a bonding wave between the two wafers.

In accordance with a particular aspect, the device further comprises at least one chock to maintain the peripheral side of the two wafers in alignment relative to each other.

In accordance with a further aspect, the substrate carrier device comprises a support platen having flatness defects of less than 15 micrometers.

BRIEF DESCRIPTION OF THE FIGURES

Other characteristics and advantages of the invention become apparent from the following description of particular implementations of the invention, given by way of non-limiting example with reference to the accompanying drawings in which.

DETAILED DESCRIPTION OF THE INVENTION

Figure 1A:
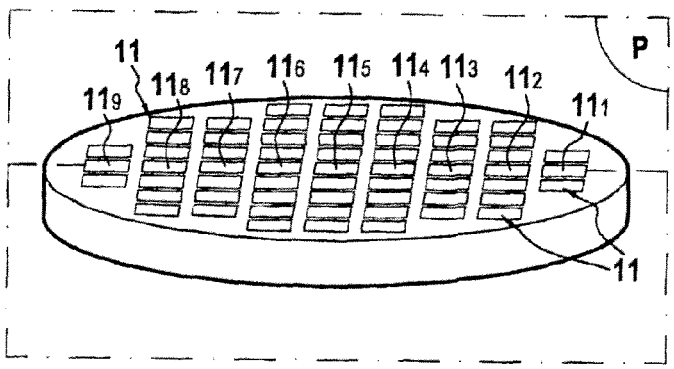
FIGS. 1A to 1E are diagrammatic views showing the production of a prior art three-dimensional structure.
Figure 1B:
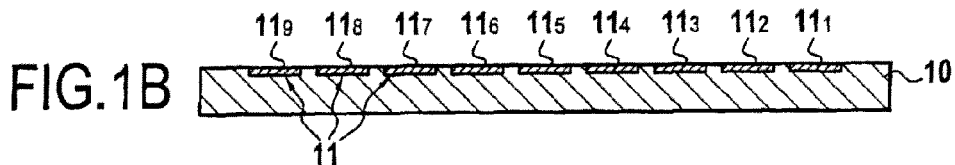
Figure 1C:
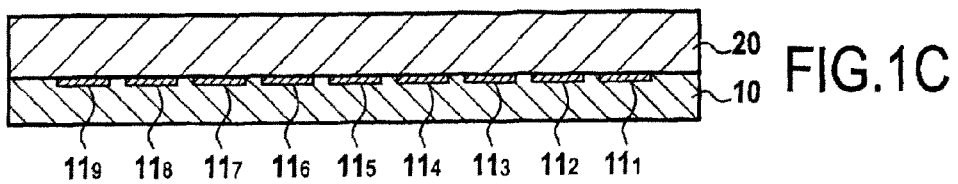
Figure 1D:
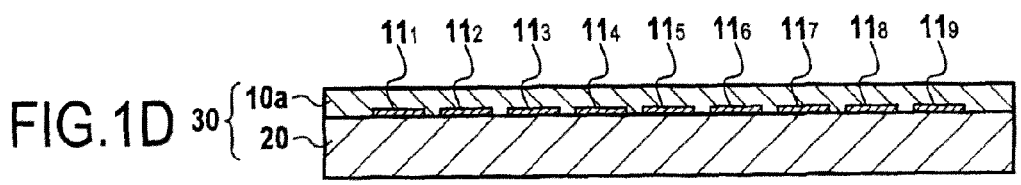
Figure 1E:
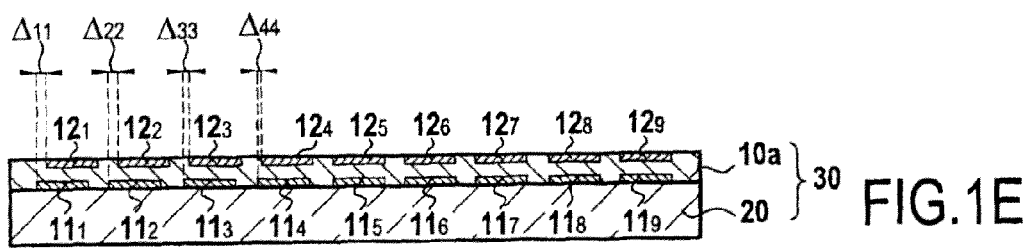

The present invention is of general application to the production of composite structures, comprising at least bonding by molecular bonding of a first substrate or wafer onto a second substrate or wafer.

Bonding by molecular bonding is a technique that is well known per se. It should be recalled that the principle of bonding by molecular bonding is based on bringing two surfaces into direct contact, i.e., without using a specific material (adhesive, wax, soldering, etc.). Such an operation requires that the surfaces to be bonded be sufficiently smooth, free of particles or contamination, and that they be brought sufficiently close to each other to allow contact to be initiated, typically to a distance of less than a few nanometers. Under such circumstances, the attractive forces between the two surfaces are high enough to cause molecular adhesion (bonding induced by the set of attractive forces (Van der Waals forces) of electronic interaction between atoms or molecules of the two surfaces to be bonded).

Molecular bonding is carried out by initiating a contact point on a wafer in intimate contact with another wafer in order to trigger the propagation of a bonding wave from that contact point. The term "bonding wave" herein means the connection or molecular bonding front that is propagated from the initiation point; it corresponds to the diffusion of attractive forces (Van der Waals forces) from the contact point over the entire intimate contact surface between the two wafers (bonding interface). The contact point is typically initiated by applying mechanical pressure to the exposed surface of one of the two wafers.

The Applicant has demonstrated that the relative movements between certain patterns or microcomponents in a single wafer appear following the step of bonding that wafer to another by molecular bonding. More precisely, experiments carried out by the Applicant have shown that stresses (tensile and/or compressive) arise at the contact point, i.e., the region where the mechanical pressure is applied. These stresses are the source of the non-homogeneous deformations appearing in the wafer and, as a result, of the relative and unequal movements of certain patterns or microcomponents relative to one another.

The Applicant has observed that the deformations are principally located at and around the contact point and that these deformations are elastic. These deformations may extend over a radius of up to 15 cm [centimeter] about the contact point when this results from mechanical contact of a tool, for example, a stylus, on the surface of one of the two wafers. As a consequence, by applying a contact point to one of the exposed faces or surfaces of one of the two wafers, deformations are created in the useful portion of the wafer, i.e., the portion intended to form devices such as microcomponents.

Consequently, the present invention proposes a solution that means that a bonding wave can be initiated between two wafers without applying a mechanical contact point directly to the surface of one of the two wafers. To this end, in accordance with the method of the invention, a bonding wave is initiated between two wafers by applying a contact force to the peripheral side of one of the two wafers. The term "peripheral side" of a wafer means any portion of wafer that is located at the wafer periphery and that is not parallel to the faces or surfaces thereof. The peripheral side may correspond to the side of the wafer or to inclined or rounded surfaces, as often happens when the wafer has an edge rounding at the periphery of its surfaces, acting to facilitate their manipulation and to avoid breakages that could occur if these sides projected, such breakages being sources of particle contamination at the wafer surfaces.

Figure 2A:
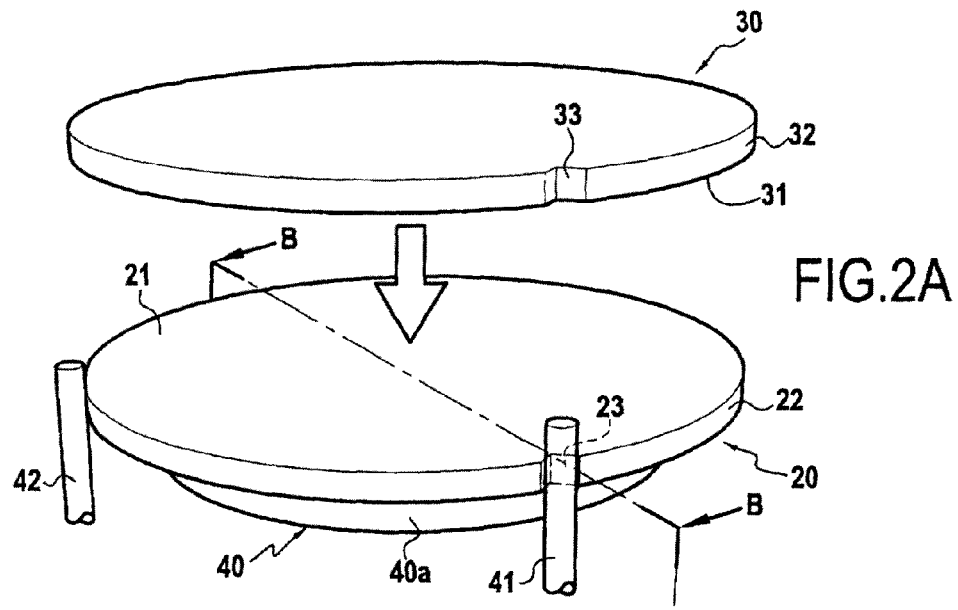
FIGS. 2A and 2B are diagrammatic views of a method of bonding by molecular bonding in accordance with one implementation of the invention.
Figure 2B:
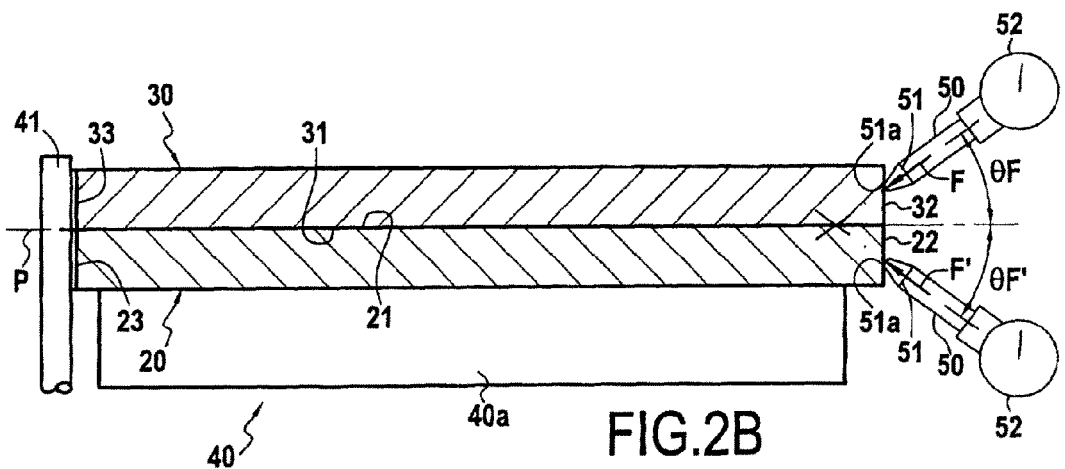

Application of the contact force at the wafer peripheral side may be carried out using a tool. In FIG. 2A, a first wafer or substrate 20 is placed in a bonding machine comprising a substrate carrier device 40. The substrate carrier device 40 comprises a support platen 40a that preferably has flatness defects of less than 15 micrometers. The support platen 40a holds the first wafer 20, for example, by means of an electrostatic or suction system associated with the support platen 40a or simply by gravity, with a view to assembling it with a second wafer or substrate 30 by molecular bonding. The associated systems for holding the wafer (electrostatic or by suction) are used provided that it has been ascertained that they do not deform the wafer so that no increase in overlay is caused. Once the wafer 20 is held on the support platen 40a, the lower surface or face 31 of the wafer 30 is positioned facing the upper surface 21 of the wafer 20 (FIG. 2B).

As is explained below and in known manner, the respective surfaces 21 and 31 of wafers 20 and 30 that are intended to be bonded have been prepared (polishing, cleaning, hydrophobic/hydrophilic treatment, etc.) in order to allow molecular bonding.

In accordance with one aspect of the invention, the peripheral side of wafers 20 and 30 is in contact with a chock 41, in particular in order to prevent the wafers from becoming offset relative to each other during application of the contact force.

In the example described here, the wafers 20 and 30 each include an alignment key 23, 33 in the form of a notch that facilitates their positioning (microscopic alignment) prior to bonding. In this example, the chock 41 is preferably in contact with the side of wafers 20 and 30 at the alignment keys 23 and 33 in order to ensure that the micrometric alignment between the two wafers is caused during application of the contact force. The chock 41 has a shape and/or dimensions that allow it to penetrate at least partially into the keys 23 and 33.

Figure 2C:
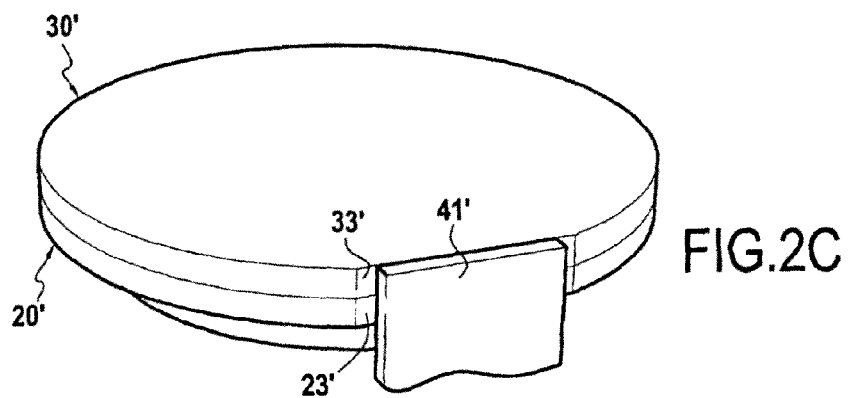
FIG. 2C shows a variation in the shape of the alignment keys for the wafers of FIG. 2A.

FIG. 2C illustrates another example in which the wafers 30' and 40' include alignment keys 33' and 23' in the form of a flat. In this example, a chock 41' preferably has a rectangular shape allowing good contact with the keys 33' and 23'.

As described below, the contact force is preferably applied at a region of the peripheral side of one or both wafers that is diametrically opposite to that in contact with the chock. In certain configurations, one or more additional chocks may be used. This happens in particular when, as illustrated in FIG. 2A, a chock 41 is desired at the keys 23 and 33. If it is not possible to apply the contact force at a region of the side of one or both wafers diametrically opposite to the chock 41, for example, because of the bulk of the bonding machine employed, then an additional chock 42 is used that will be disposed in a region diametrically opposite to that available for application of the contact force.

In certain configurations, such as those where the contact force is applied to the side of two wafers simultaneously, it may be preferable not to hold the lower wafer flush against a support platen (by suction or electrostatic force, for example), but simply to place it on the platen, the chock or chocks then being the only means for holding the wafers in position.

In FIG. 2B, initiation of a contact point for molecular bonding is carried out using a tool 50. As illustrated in a highly diagrammatic manner in FIG. 2B, the tool 50 is in the form of a stylus comprising a free end 51 with which a contact force is exerted on the peripheral side of at least one of the two wafers 20, 30.

The contact force may be applied to one side of a wafer only or to the side of two wafers simultaneously, in a direction substantially parallel to the plane of the wafers or in a direction forming an angle with the plane of the wafers, the angle being in the range −90° to +90°.

In the implementation described here, the contact force applied with the tool 50 to the peripheral side of at least one of the two wafers is oriented in a direction forming an angle with a plane $\underline{P}$ of the wafers that is preferably more than 0° and less than ±45°. More precisely, when a contact force F is applied to a peripheral side 32 of the upper wafer 30, the tool 50 is orientated relative to the plane $\underline{P}$ of the wafers at an angle $O_F$ of more than 0° and less than +45°. Similarly, when a contact force F' is applied to the peripheral side 22 of the upper wafer 20, the tool 50 is orientated relative to the plane $\underline{P}$ of the wafers at an angle $\theta_F'$ of less than −45° and more than 0°.

Figure 3:
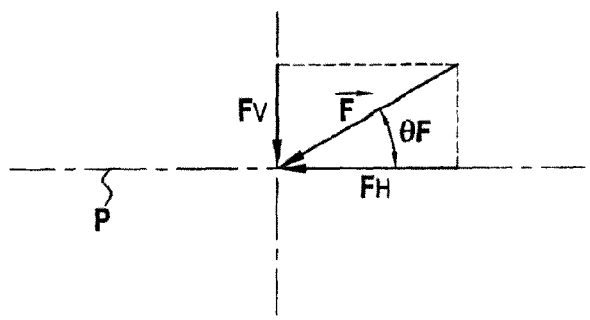
FIG. 3 is a graph showing the vertical and horizontal components resulting from application of a contact force in accordance with the invention.

As can be seen in FIG. 3, when the contact force is applied to the peripheral side 32 of the upper wafer 30, the angle $\theta_F$ formed between the direction of application of the contact force vector and the plane of the wafers creates a vertical component of the force, $F_V$, that can initiate a bonding wave. Furthermore, this angle is less than +45° in order to minimize the vertical component $F_V$ that cannot be determined precisely because of the absence of direct mechanical contact with the surface of the wafer. By limiting the angle to a value of less than 45° relative to the plane of the wafer, the amplitude or magnitude of the vertical component $F_v$ applied perpendicular to the plane of the wafer is at least half that of the contact force F.

However, it should be noted that a bonding wave may also be initiated by applying a contact force in a direction substantially parallel to the plane of the wafers. The contact force then induces a vibration that brings the wafers closer and can initiate a bonding wave.

By selecting, in accordance with the invention, a point for application of the contact force that is localized on the peripheral side thereof, the impact of deformations on the quality of the wafer is minimized. In fact, even if deformations are created following application of the contact force, they extend over a restricted zone at the side of the wafer that is located outside the useful portion of the wafer.

In order to further minimize the appearance of deformations on the wafer surface, the mechanical pressure exerted on the surface of the wafer by the vertical component resulting from the contact force is preferably less than 1 MPa. In order to achieve this limitation to the mechanical pressure in the vertical component, it is possible, for example, to control the value of the mechanical pressure exerted by the contact force F on the peripheral side of the wafer. The amplitude or magnitude of the contact force F may be controlled by connecting the tool 50 to a dynamometer 52. Knowing the contact surface area 51a for the tool 50 with the peripheral side of the wafer, which may, for example, be in the range 0.3 mm² [square millimeter] to 1 mm², it is possible to control the exerted mechanical pressure by controlling the contact force F exerted by the tool on the wafer (load=mechanical pressure× bearing surface area). As indicated above, since the amplitude of the vertical component of the contact force and, as a consequence, the mechanical pressure exerted at the surface of the wafer, is divided by at least 2 compared with those for the contact force, then it suffices to exert a mechanical pressure on the peripheral side of the wafer of less than 2 MPa in order to ensure that the mechanical pressure on the surface of the wafer is less than 1 MPa.

Furthermore, as illustrated in FIG. 3, the contact force F principally has a horizontal component $F_H$. The contact force applied with the tool is transmitted in the form of a brief impulse (shock) of duration that is typically less than 1 second or less than half a second. If a bonding wave is not initiated during a first impulse, it may be repeated until a bonding wave is initiated.

The bearing tool, and more particularly its end intended to come into contact with the peripheral side of the wafer, may be produced from or covered with a material such as TEFLON®, silicone or a polymer. In general, the end of the tool is produced from or coated with a material that is sufficiently rigid to be able to transmit the contact force in a reliable manner. Too flexible a material could deform and result in an inaccurate contact surface. Furthermore, too rigid a material could result in the formation of defects (impressions) on the wafer.

The method of bonding by molecular bonding of the invention may be carried out automatically in a bonding machine or device. Under such circumstances, the machine comprises a substrate carrier device similar to that described above and a tool connected to an actuator (for example, a jack or a mechanical arm). The machine also includes a servocontrol intended to control the actuator. The servocontrol controls the actuator in a manner that controls the angle of application of the contact force applied by the tool. The mechanical pressure exerted by the tool may also be controlled by the servocontrol that receives data from a force sensor and compares the data with a predetermined load that is a function of the mechanical pressure that is intended to be applied and of the surface area of the end of the bearing element.

The bonding device may further include one or more chocks intended to ensure micrometric alignment between the wafers as well as to maintain them in alignment during application of the contact force.

Figure 4:
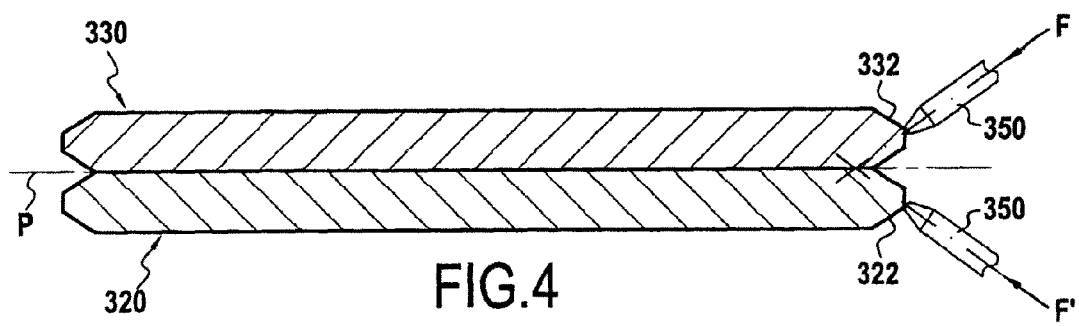
FIGS. 4 and 5 are diagrammatic views showing one implementation of a method of bonding by molecular bonding of the invention with wafers having respectively different edge rounding geometries.

FIG. 4 shows the application of the method of bonding by molecular bonding of the invention between two wafers 320 and 330 respectively comprising on their peripheral side 322 and 332 an edge rounding in the form of chamfers. In the same manner as that described above, the bonding wave is initiated by application, using a tool 350, of a contact force F onto the peripheral side of one of the two wafers 320, 330.

Figure 5:
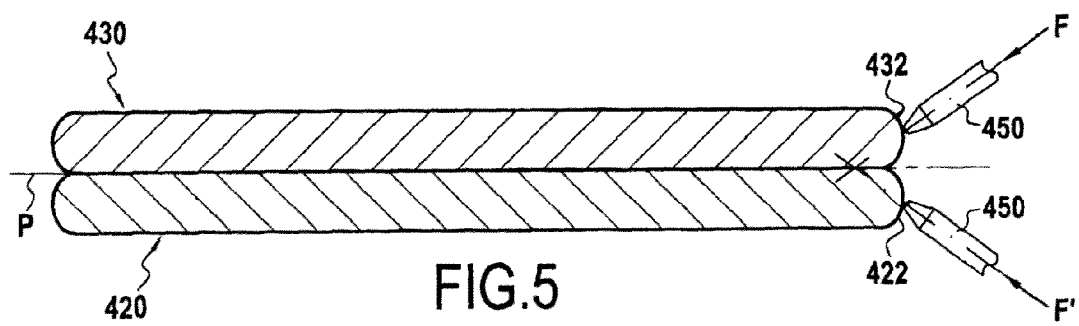

FIG. 5 shows the application of a method of bonding by molecular bonding of the invention between two wafers 420 and 430 respectively comprising on their peripheral side 422 and 432 an edge rounding in a rounded form. As described above, the bonding wave is initiated by application, using a tool 450, of a contact force F to the peripheral side of one of the two wafers 420, 430.

The method of the invention is applicable to assembling any type of material compatible with molecular bonding, in particular semiconductor materials such as silicon, germanium, glass, quartz, sapphire, etc. The wafers to be assembled may in particular have a diameter of 100 mm, 150 mm, 200 mm, or 300 mm. The wafers may also include microcomponents over the majority of their surface or only over a limited zone.

A particular, but not exclusive, field for the bonding method of the present invention is that of producing three-dimensional structures.

A method of producing a three-dimensional structure by transfer of a layer of microcomponents formed on an initial substrate onto a final substrate in accordance with one implementation of the invention is described below with reference to FIGS. 6A to 6D and 7.

Figure 6A:
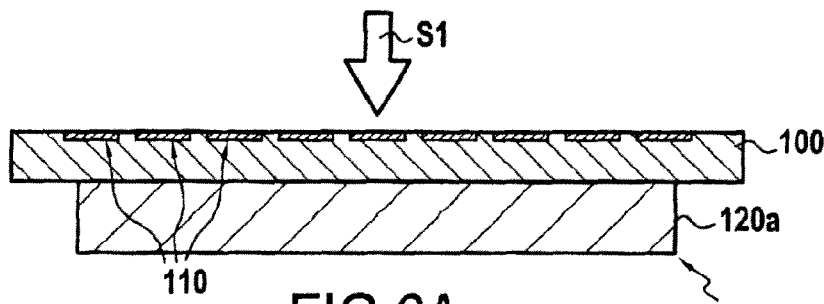
FIGS. 6A to 6D are diagrammatic views showing the production of a three-dimensional structure employing the method of bonding by molecular bonding of the present invention.
Figure 6B:
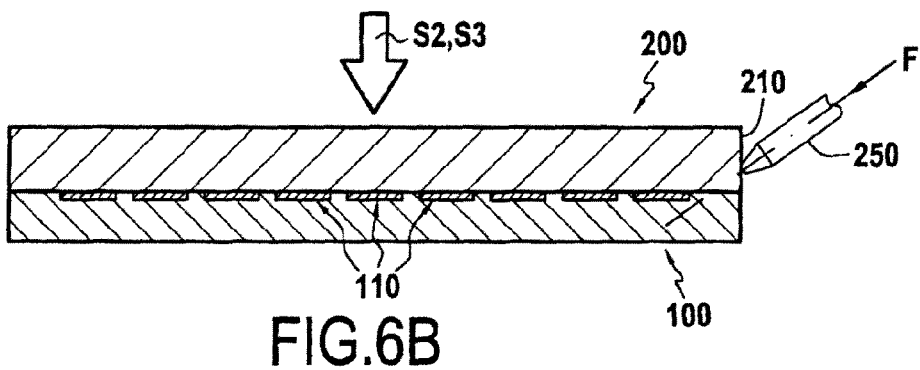

Producing a three-dimensional structure commences by forming a first series of microcomponents 110 on the surface of an initial wafer or substrate 100 (FIG. 6A, step S1). The microcomponents 110 may be whole components and/or only a portion thereof. The initial substrate 100 may be a monolayer structure, for example, a layer of silicon, or a multilayer structure such as a SOI type structure. The microcomponents 110 are formed by photolithography using a mask that can define zones for forming patterns corresponding to microcomponents 110 to be produced. During the formation of the microcomponents 110 by photolithography, the initial substrate 100 is held on a substrate carrier device 120. The substrate carrier device comprises a support platen 120a against which the initial substrate 100 is held flush, for example by means of an electrostatic or a suction system associated with the support platen 120a.

The face of the initial substrate 100 comprising the microcomponents 110 is then positioned facing one face of a final wafer or substrate 200 (step S2, FIG. 6B) with a view to bonding by molecular bonding. A layer of oxide, for example, $SiO_2$, may also be formed on the face of the initial substrate 100 comprising the microcomponents 110 and/or on the face of the final substrate 200 intended to be brought into intimate contact.

In accordance with the invention, a contact force F is applied to the peripheral side 210 of the final substrate 200 using a tool 250 (step S3). The force F is applied in a direction forming an angle with the plane of the substrate of more than 0° and less than 45°. The mechanical pressure exerted on the side 210 of the substrate 200 is preferably less than 2 MPa.

Application of the contact force causes propagation of a bonding wave on the interface between the initial substrate 100 and the final substrate 200. The two substrates are then bonded together by molecular bonding over the whole of their surfaces in contact (bonding interface), without or almost without deformation in the initial substrate 100 comprising the microcomponents 110. Thus, a buried layer of microcomponents 110 is obtained at the bonding interface between the substrates 100 and 200.

In a variation of step S2, the final wafer or substrate 200 is placed on the substrate carrier device and the substrate 100 provided with microcomponents is positioned facing this substrate 200. A contact force F is then applied to the peripheral side 210 of the final substrate 200 and/or to the peripheral side of the substrate 100 using a tool 250.

Figure 6C:
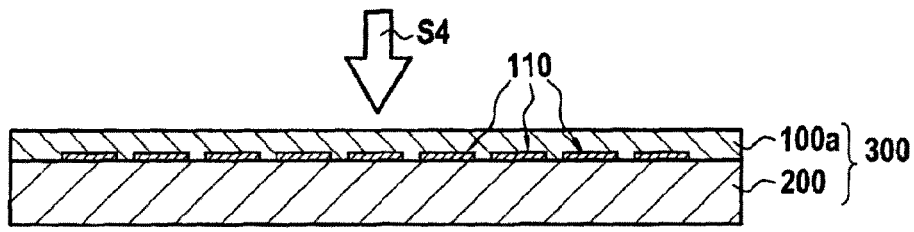

Following bonding and as can be seen in FIG. 6C, the initial substrate 100 is thinned in order to withdraw a portion of the material present above the layer of microcomponents 110 (step S4). When the substrate 100 is a SOI type substrate, the buried insulating layer may advantageously be used to define the thickness of the remaining layer 100a. A composite structure 300 is then obtained, formed by the final substrate 200 and a layer 100a corresponding to the remaining portion of the initial substrate 100. The initial substrate 100 may be thinned, in particular by chemical mechanical polishing (CMP), chemical etching, or by splitting or fracture along a plane of weakness that has previously been formed in the substrate by atomic implantation.

Figure 6D:
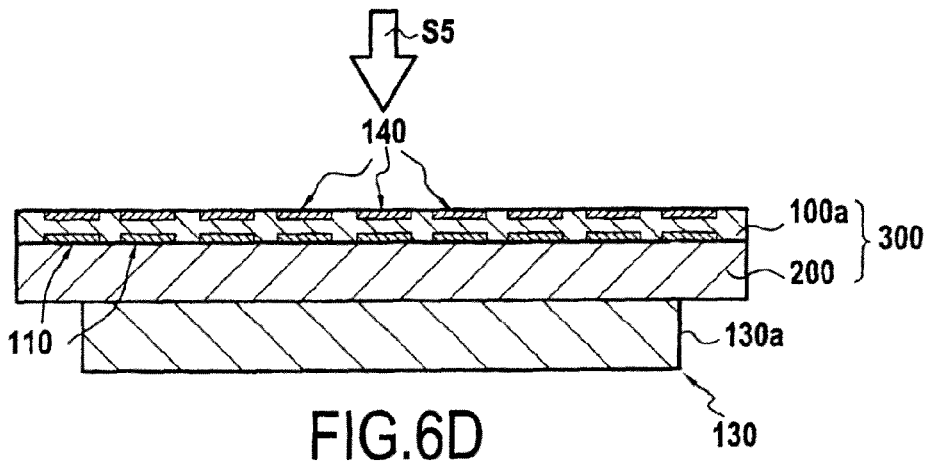
Figure 7:
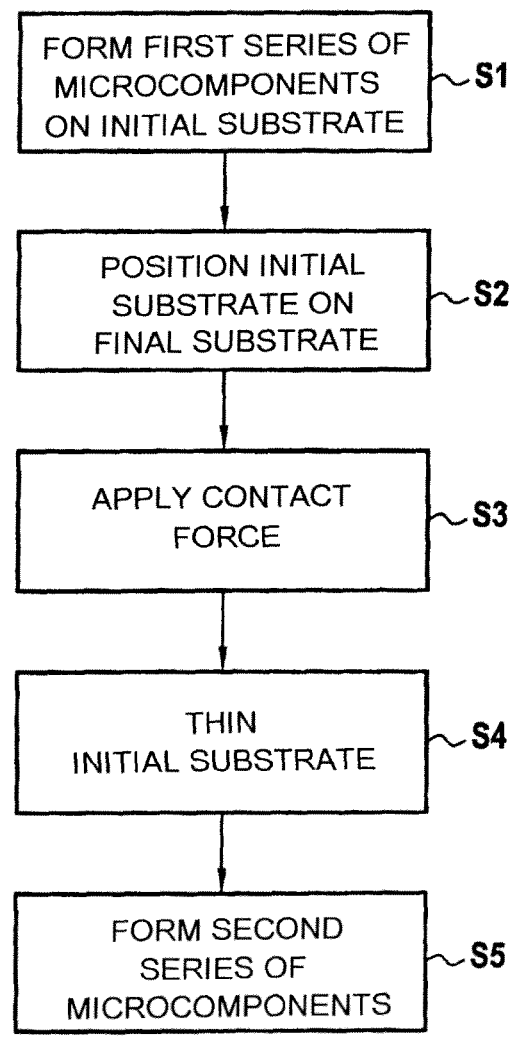
FIG. 7 is a chart showing the steps carried out during the production of the three-dimensional structure illustrated in FIGS. 6A to 6D.

As can be seen in FIG. 6D, the next step in producing the three-dimensional structure consists in forming a second layer of microcomponents 140 at the exposed surface of the thinned initial substrate 100 (FIG. 6D, step S5). The microcomponents 140 may correspond to complementary portions of the microcomponents 110 in order to form a finished component and/or to distinct components intended to function with the microcomponents 140. In order to form the microcomponents 140 in alignment with the buried microcomponents 110, a photolithography mask is used that is similar to that used to form the microcomponents 110. In similar manner to the formation of the microcomponents 110, the composite structure 300 formed by the final substrate 200 and the layer 100a is held on a support platen 130a of a substrate carrier device 130 that is identical to the device 120. The photolithography mask is then applied to the free surface of the layer 100a.

In a variation, the three-dimensional structure is formed by a stack of layers, each layer having been transferred by the assembly method of the present invention, and each layer being in alignment with the directly adjacent layers.

In yet another variation, the final substrate 200 also comprises microcomponents.

The method of bonding by molecular bonding of the invention means that it has been possible to bond the initial substrate 100 to the final substrate without deformation or at least with a reduction in deformations such that significant offsets in the microcomponents 110 before and after transfer of the initial substrate 100 onto the final substrate 200 are no longer observed. Thus, the residual offsets can be limited to values of less than 200 nm, or even 100 nm, in a homogeneous manner over the entire surface of the wafer. The microcomponents 140, even those with very reduced dimensions (for example, <1 μm), may then readily be formed in alignment with the microcomponents 110, even after transfer of the initial substrate. This means, for example, that the microcomponents present in two layers or on two distinct faces of the same layer can be interconnected via metal connections, minimizing the risks of poor interconnections.

Consequently, the method of the present invention means that the phenomenon of overlay during transfer of a circuit layer onto another layer or onto a support substrate can be eliminated, and that very high quality multilayer semiconductor wafers can be produced.

The invention claimed is:

1. A method of bonding a first wafer and a second wafer by molecular bonding, comprising:
    positioning a face of the second wafer over a face of the first wafer; and
    applying a contact force to a peripheral side of at least one of the first wafer and the second wafer without contacting and applying a contact force to a face of the at least one of the first and second wafers and initiating a bonding wave between the first wafer and the second wafer, the peripheral side comprising a portion of the at least one of the first wafer and the second wafer situated at a periphery of the at least one of the first wafer and the second wafer and that is not parallel to the face of the first wafer and the face of the second wafer.

2. The method of claim 1, further comprising contacting a peripheral side of each of the first wafer and the second wafer with at least one chock.

3. The method of claim 2, wherein the peripheral side of each of the first wafer and the second wafer comprises an alignment key, and wherein the method further comprises contacting the at least one chock with the peripheral side of each of the first wafer and the second wafer at the alignment key.

4. A method of bonding a first wafer and a second wafer by molecular bonding, comprising:
   positioning a face of the second wafer over a face of the first wafer; and
   applying a contact force to a peripheral side of at least one of the first wafer and the second wafer and initiating a bonding wave between the first wafer and the second wafer, the peripheral side comprising a portion of the at least one of the first wafer and the second wafer situated at a periphery of the at least one of the first wafer and the second wafer and that is not parallel to the face of the first wafer and the face of the second wafer,
   wherein applying the contact force further comprises simultaneously applying a first contact force to a peripheral side of the first wafer and applying a second contact force to a peripheral side of the second wafer, the first contact force and the second contact force being directed in directions forming respective angles with a plane of the first wafer and the second wafer.

5. The method of claim 4, further comprising selecting the respective angles to be in a range extending from −90° to +90°.

6. The method of claim 4, wherein applying the first contact force to the peripheral side of the first wafer comprises directing the first contact force in a direction forming an angle with the plane that is more than 0° and less than +45°.

7. The method of claim 5, wherein applying the second contact force to the peripheral side of the second wafer comprises directing the second contact force in a direction forming an angle with the plane that is more than −45° and less than 0°.

8. The method of claim 1, wherein applying the contact force comprises applying a mechanical pressure of less than 2 MPa.

9. The method of claim 1, wherein applying the contact force comprises applying a plurality of impulses to the peripheral side of the at least one of the first wafer and the second wafer.

10. The method of claim 1, wherein applying the contact force comprises pressing a tool on the peripheral side of the at least one of the first wafer and the second wafer.

11. A method of producing a composite three-dimensional structure, comprising:
   producing a first layer of microcomponents on a face of a first wafer; and
   bonding the face of the first wafer comprising the layer of microcomponents onto a face of a
   second wafer by molecular bonding,
   wherein bonding the face of the first wafer onto the face of the second wafer comprises:
      contacting the face of the second wafer with the face of the first wafer; and
      applying a contact force to a peripheral side of at least one of the first wafer and the second wafer without contacting and applying a contact force to a face of the at least one of the first and second wafers and initiating a bonding wave between the first wafer and the second wafer, the peripheral side comprising a portion of the at least one of the first wafer and the second wafer situated at a periphery of the at least one of the first wafer and the second wafer and that is not parallel to the face of the first wafer and the face of the second wafer.

12. The method of claim 11, further comprising thinning the first wafer after bonding the face of the first wafer onto the face of the second wafer.

13. The method of claim 11, further comprising producing a second layer of microcomponents on another face of the first wafer opposite the face comprising the first layer of microcomponents.

14. The method of claim 11, further comprising forming a layer of oxide on the face of the first wafer comprising the first layer of microcomponents.

15. The method of claim 11, further comprising selecting the first wafer to comprise a SOI type structure.

16. The method of claim 11, wherein at least the first layer of microcomponents comprises image sensors.

17. A device for bonding together a lower wafer and an upper wafer, comprising:
   a substrate carrier device configured to support the lower wafer and the upper wafer thereon such that a lower face of the upper wafer is positioned facing an upper face of the lower wafer; and
   a tool arranged and configured to apply a contact force to a peripheral side of at least one of the upper wafer and the lower wafer without contacting and applying a contact force to a face of the at least one of the first and second wafers and initiate a bonding wave between the upper wafer and the lower wafer, the peripheral side comprising a portion of the at least one of the upper wafer and the lower wafer that is situated at a periphery of the at least one of the upper wafer and the lower wafer and that is not parallel to the lower face of the upper wafer and the upper face of the lower wafer.

18. The device of claim 17, further comprising at least one chock located and configured to hold a peripheral side of the upper wafer in alignment relative to a peripheral side of the lower wafer.

19. The device of claim 17, wherein the substrate carrier device comprises a support platen having flatness defects of less than 15 micrometers.

20. A method of bonding a first wafer and a second wafer by molecular bonding, comprising:
   positioning a face of the second wafer over a face of the first wafer; and
   applying a contact force to a peripheral side of at least one of the first wafer and the second wafer and initiating a bonding wave between the first wafer and the second wafer, the peripheral side comprising a portion of the at least one of the first wafer and the second wafer situated at a periphery of the at least one of the first wafer and the second wafer and that is not parallel to the face of the first wafer and the face of the second wafer,
   wherein applying the contact force further comprises simultaneously applying a first contact force to a peripheral side of the first wafer and applying a second contact force to a peripheral side of the second wafer, each of the first contact force and the second contact force being directed in a direction substantially parallel to a plane of the first wafer and the second wafer.

* * * * *